(12) United States Patent
Jing (10) Patent No.: US 9,700,914 B2
(45) Date of Patent: Jul. 11, 2017

(54) COATING DEVICE, SYSTEM AND METHOD FOR SEALANT

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Yangkun Jing, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/786,348

(22) PCT Filed: May 21, 2015

(86) PCT No.: PCT/CN2015/079491
§ 371 (c)(1),
(2) Date: Oct. 22, 2015

(87) PCT Pub. No.: WO2016/050085
PCT Pub. Date: Apr. 7, 2016

(65) Prior Publication Data
US 2016/0252754 A1 Sep. 1, 2016

(30) Foreign Application Priority Data
Sep. 30, 2014 (CN) .......................... 2014 1 0523099

(51) Int. Cl.
*B05D 1/02* (2006.01)
*B05D 5/10* (2006.01)
(Continued)

(52) U.S. Cl.
CPC .................. *B05D 1/02* (2013.01); *B05B 9/03* (2013.01); *B05B 12/00* (2013.01); *B05B 15/00* (2013.01);
(Continued)

(58) Field of Classification Search
CPC .... B05D 1/02; B05D 5/10; B05C 5/02; B05C 5/0225; B05C 5/0212; G02F 1/1303;
(Continued)

(56) References Cited

U.S. PATENT DOCUMENTS 3,974,508 A * 8/1976 Blumenthal ............... B41J 2/19
347/22
2006/0284924 A1* 12/2006 Byun ................... B41J 2/16552
347/33

(Continued)

FOREIGN PATENT DOCUMENTS

CN 101257978 A 9/2008
CN 101712022 A 5/2010
(Continued)

OTHER PUBLICATIONS

English-Language Machine Translation of CN 104238202 A, Generated Aug. 21, 2016, 16 Pages.*
(Continued)

*Primary Examiner* — William Phillip Fletcher, III
(74) *Attorney, Agent, or Firm* — Ladas & Parry LLP (57) ABSTRACT

A coating device for sealant and a coating method for sealant coating are disclosed. The coating device includes a sealant storage pipe provided with two end portions; one end portion is connected to a gas jet means and the other end portion is connected to a nozzle; a pipe wall of the sealant storage pipe is made from a flexible material; and the pipe wall can be subjected to recoverable inward deformation perpendicular to an axial line of the sealant storage pipe. A
(Continued)

coating method for sealant coating, comprising: subjecting a pipe wall to recoverable inward deformation perpendicular to an axial line of a sealant storage pipe during spraying; and subjecting the pipe wall to recovery when the spraying ends.

17 Claims, 6 Drawing Sheets (51) Int. Cl.
| | |
|---|---|
| G02F 1/13 | (2006.01) |
| B05B 9/03 | (2006.01) |
| G02F 1/1339 | (2006.01) |
| H01L 41/02 | (2006.01) |
| H01L 41/09 | (2006.01) |
| H01L 41/04 | (2006.01) |
| H01L 41/08 | (2006.01) |
| B05C 5/02 | (2006.01) |
| B05B 17/04 | (2006.01) |
| B05B 15/00 | (2006.01) |
| B05B 12/00 | (2006.01) |
| B05C 5/00 | (2006.01) |
| B05C 11/10 | (2006.01) |
| F04B 43/04 | (2006.01) |
| B05D 3/14 | (2006.01) |
| B05D 7/22 | (2006.01) |
| H01L 21/67 | (2006.01) |

(52) U.S. Cl.
CPC ............... *B05B 17/04* (2013.01); *B05C 5/00* (2013.01); *B05C 5/02* (2013.01); *B05C 5/0225* (2013.01); *B05C 11/1047* (2013.01); *B05D 5/10* (2013.01); *F04B 43/04* (2013.01); *G02F 1/1303* (2013.01); *G02F 1/1339* (2013.01); *H01L 41/02* (2013.01); *H01L 41/04* (2013.01); *H01L 41/08* (2013.01); *H01L 41/09* (2013.01); *H01L 41/092* (2013.01); *H01L 41/0906* (2013.01); *H01L 41/0913* (2013.01); *H01L 41/0926* (2013.01); *B05C 5/0212* (2013.01); *B05D 3/14* (2013.01); *B05D 7/22* (2013.01); *H01L 21/6715* (2013.01)

(58) Field of Classification Search
CPC ....... G02F 1/1339; H01L 41/02; H01L 41/04; H01L 41/08; H01L 41/09; H01L 41/0906; H01L 41/0913; H01L 41/092; H01L 41/0926; B05B 9/03; B05B 12/00; B05B 15/00; B05B 17/04
USPC .... 427/8, 256, 261, 265, 64, 66, 401, 421.1, 427/427.3, 427.4; 239/546, 602; 118/300, 323
See application file for complete search history.

(56) References Cited

U.S. PATENT DOCUMENTS

| | | | |
|---|---|---|---|
| 2007/0018540 A1* | 1/2007 | Seto | ..................... B41J 2/14209 310/369 |
| 2010/0245495 A1* | 9/2010 | Katada | ..................... B41J 2/175 347/85 |
| 2012/0100286 A1* | 4/2012 | Sharma | .................. H05K 3/182 427/125 |
| 2012/0283630 A1* | 11/2012 | Lee | ................... A61M 5/16827 604/65 |
| 2015/0282751 A1* | 10/2015 | Konno | ................. A61B 5/6866 600/365 |

FOREIGN PATENT DOCUMENTS

| | | |
|---|---|---|
| CN | 202460935 U | 10/2012 |
| CN | 102962170 A | 3/2013 |
| CN | 104238202 A | 12/2014 |
| EP | 1925369 A1 | 5/2008 |
| EP | 2248599 A1 | 11/2010 |
| JP | 2004-322605 A * | 11/2004 |

OTHER PUBLICATIONS

English-Language Machine Translation of JP 2004-322605 A, Generated Aug. 21, 2016, 11 Pages.*
International Search Report & Written Appln. No. PCT/CN2015/079491; Dated Aug. 26, 2015.
Wu Senyang, "Research on the piezoelectric printhead of forming with micro-droplete jetting", China Master's Theses Full-text Database, Engineering Science and Technology, II Series, vol. S2, Dec. 15, 2013, 9 pages.
First Chinese Office Action dated Sep. 5, 2016; Appln. No. 201410523099.3.

* cited by examiner

COATING DEVICE, SYSTEM AND METHOD FOR SEALANT

TECHNICAL FIELD

Embodiments of the present invention relate to a coating device, a coating system and a coating method.

BACKGROUND

In recent years, representative sophisticated technology employed in the liquid crystal display (LCD) industry includes one drop fill (ODF), in-plane switching (IPS), dual domain, high resolution process (HRP), etc. ODF is new high-efficiency technology which integrates a series of technologies such as hot press, liquid crystal fill (LC Fill), end seal, cell cleaner and cell annealing. The ODF technology is as follows: liquid crystals are dropped on a substrate (thin-film transistor (TFT) or color filter (CF)); sealant is uniformly coated on another corresponding substrate; and after the coating and dropping processes are completed, high-accuracy cell-assembly is performed to form a liquid crystal cell. By adoption of the ODF technology, the process sequence can be reduced; the cell gap can be reduced; and the response time can be shortened. However, most methods in the prior art have the problem of sealant wall-hanging in the case of spraying.

SUMMARY

Embodiments of the present invention provide a coating device, system and method for sealant coating.

One embodiment of the present invention provides a coating device for sealant, which comprises: a sealant storage pipe, wherein the sealant storage pipe is provided with two end portions; one end portion is connected to a gas jet means and the other end portion is connected to a nozzle; a pipe wall of the sealant storage pipe is made from a flexible material; and the pipe wall can be subjected to recoverable inward deformation perpendicular to an axial line of the sealant storage pipe.

Optionally, the flexible material is a piezoelectric material; and the pipe wall is deformed when an electric field is applied and recovered when the electric field is removed.

Optionally, the piezoelectric material is one or more selected from piezocrystal, piezoceramics, piezopolymer and piezoelectric ceramic-polymer composite.

Optionally, the flexible material is a carbon nanotube rubber material; and the pipe wall is deformed when a clamping force is applied and recovered when the clamping force is removed.

Another embodiment of the present invention further provides a coating system for sealant, which comprises: a main control unit, a gas source unit connected to the main control unit, deformation control devices, and the foregoing coating device connected to the gas source unit. The main control unit is configured to control the amount of gas introduced from the gas source unit into the coating device, and hence control the amount of glue sprayed out from the coating device. The main control unit is configured to control the deformation control devices to act on the coating device, so that the pipe wall of the sealant storage pipe of the coating device is subjected to inward deformation perpendicular to the axial line of the sealant storage pipe or recovery.

Optionally, the sealant storage pipe is made from a carbon nanotube rubber material; the deformation control device includes a clamping component for clamping the sealant storage pipe and a motor connected to the clamping component; and the main control unit is configured to input a control signal into the motor and control the clamping component to apply an inward clamping force from the outside of the pipe wall to the inside, so that the pipe wall is subjected to inward deformation perpendicular to the axial line of the sealant storage pipe.

Optionally, the sealant storage pipe is made from a piezoelectric material; the deformation control devices are electrode assemblies for clamping both sides of the pipe wall; and the main control unit is configured to input a control signal into the electrode assemblies and control the electrode assemblies to apply an inward electric field from the outside of the pipe wall to the inside, so that the pipe wall is subjected to inward deformation perpendicular to the axial line of the sealant storage pipe.

Optionally, the coating system may further comprise a coating pressure machine detection module connected to the main control unit; and the main control unit is configured to receive real time information of glue coated by the coating device, detected by the coating pressure machine detection module, send control information to the gas source unit, and hence control the coating quantity of the coating device.

Optionally, the coating system may further comprise a coating state detection module connected to the main control unit; and the main control unit is configured to receive real time fluctuation information of glue coated by the coating device, detected by the coating state detection module, send control information to the gas source unit, and hence control the coating quantity of the coating device.

Optionally, the coating system may further comprise a coating glue position feedback module connected to the main control unit; and the main control unit is configured to receive real time residue information of sealant in the sealant storage pipe of the coating device, detected by the coating glue position feedback module, send control information to the deformation control devices, and hence control the sealant storage pipe to be deformed.

Still another embodiment of the present invention further provides a coating method for sealant coating, which comprises the following steps: subjecting a pipe wall to recoverable inward deformation perpendicular to an axial line of a sealant storage pipe during spraying; and subjecting the pipe wall to recovery when the spraying ends.

Optionally, before spraying, the coating method may further comprise: determining the position of a substrate; reading a preset pressure value and converting the preset pressure value into a pulse value; outputting a control signal to a coating device; and detecting the residue of glue in the coating device.

Optionally, during spraying, the coating method may further comprise: applying an inward force from the outside of the pipe wall to the inside according to the residue of glue in the coating device, so that the pipe wall can be deformed inwards.

Optionally, before spraying, the coating method may further comprise: coating sealant by test; detecting the position and the sectional area of coated sealant and determining whether the preset value has been reached; returning to adjust the pressure value and converting the pressure value into the pulse value again if the preset value has not been reached; recording control pulse values of control elements if the preset value has been reached; and taking the recorded control pulse values of the control elements to be initial control pulse values in the case of spraying.

The coating device, system and method for sealant coating, provided by the embodiment of the present invention, can effectively avoid the problem of sealant wall-hanging. In the case of coating, a hose is recessed by changing the shape of the hose, so that the balancing degree of force applied to the upper portion of airflow glue can be improved. Moreover, when the amount of glue is reduced continuously, stable airflow can be guaranteed and glue coating cannot be changed due to the change of the amount of glue. In the case of sack-back, the sack-back amount can be well controlled by utilization of the outward movement of the pipe wall for sack-back; and the overall sack-back of the glue can be maintained, so that the phenomenon of slight inward breakage of the glue can be avoided.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

In order to make objects, technical details and advantages of the embodiments of the present invention apparent, the technical solutions of the embodiments will be described in a clearly and fully understandable way in connection with the drawings related to the embodiments of the present invention. Apparently, the described embodiments are just a part but not all of the embodiments of the invention. Based on the embodiments described herein, those skilled in the art can obtain other embodiment(s), without any creative work, which fall within the scope of the invention.

Figure 1:
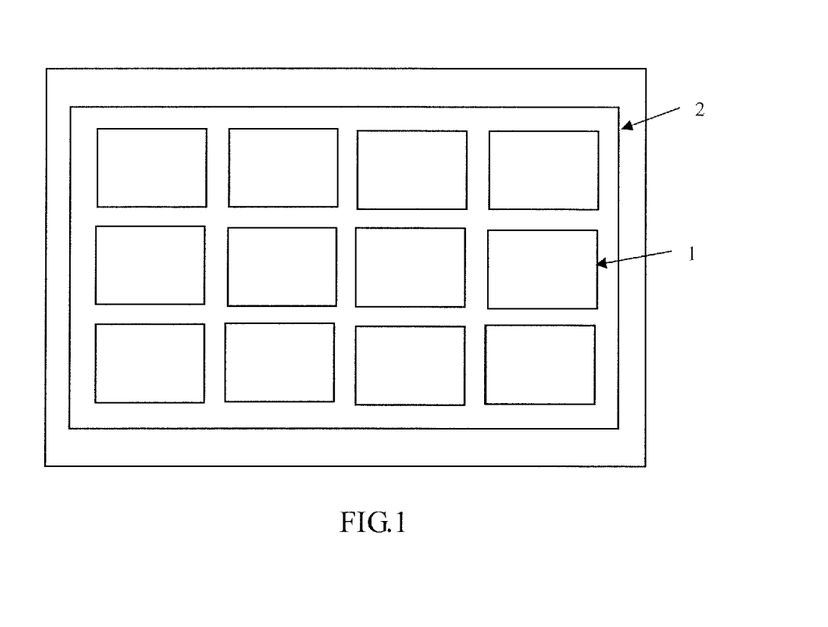
FIG. 1 is a schematic diagram illustrating main sealant coating.

As illustrated in FIG. 1, when sealant is uniformly coated on a motherboard provided with a plurality of units (3*4 in the figure) arranged in a matrix and applied in an LCD panel, the sealant coated on a glass substrate includes main sealant 1 and auxiliary sealant 2. The main sealant 1 is sealant coated on the circumference of the LCD panel and configured to seal liquid crystal molecules in the LCD panel. The auxiliary sealant 2 is sealant coated at gaps of LCD panels on the entire glass substrate.

When sealant is adopted to coat a glass substrate as shown in FIG. 1 taken as a motherboard, each sealant coating device will be responsible for the positioning of corresponding one column (or one row) of LCD panels on the glass substrate. Supposing that all the sealant as shown in FIG. 1 is coated by the same coating device, at this point, as repeated pauses will occur in the coating process, after each pause, the head of the sealant remained at a coating head of the coating device will be large due to the action of surface tension. In this case, in the case of next coating, the sectional area of the sealant will be uneven; and the sectional area of an initial point of the sealant on the glass substrate is relatively large at the beginning of each coating. Therefore, poor effects such as glue leakage and uneven thickness of the liquid crystal cell can be caused after cell-assembly, and hence the display effect of the LCD panels can be affected. In order to avoid the problems, the sealant at the coating head of the coating device must be sacked back, and poor sack-back will result in the fact that the coating head cannot be recovered after pause. Vacuum sack-back is mainly adopted currently. In the vacuum sack-back process, the force applied to the upper portion will be relatively large, so that the glue in the hose is raised up entirely and the inside of the glue will be partially separate and provided with specific bubbles or empty nests, and hence the risk of emptying can be increased.

Figure 2:
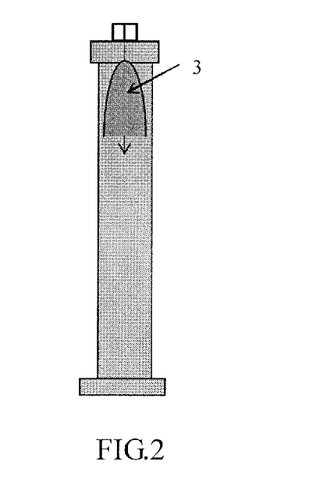
FIG. 2 is a schematic diagram illustrating the air jet form of the traditional coating device.

As illustrated in FIG. 2, in another aspect, when a coating device with a tubular structure is applied on a substrate for sealant coating, airflow 3 of compressed dry air (CDA) entering the tubular device is injected from the middle of the top, so that the pressure in the middle of the tube is large and the pressure at the position close to the wall is small; and due to the viscosity of the sealant, the viscosity between glue and glue in partial sealant will be smaller than the viscosity between glue and wall, and hence the sealant "wall-hanging" phenomenon tends to occur in the process of sealant coating. That is to say, when the glue in the tube is extruded, the glue in the middle of the tube has been emptied but residual glue is left on the peripheral pipe wall and cannot be sprayed down. In the traditional sealant coating process, a piezoelectric device is independently used for pressure balancing and sealant is coated uninterruptedly. When the piezoelectric device is used for a long time, internal charges of internal piezoceramics will be accumulated, so that the coated sealant has poor stability. If the CDA is independently used, uniform force cannot be applied to the sealant. As the sealant has large viscosity, independent ink-jet coating is also not applicable.

Figure 3A:
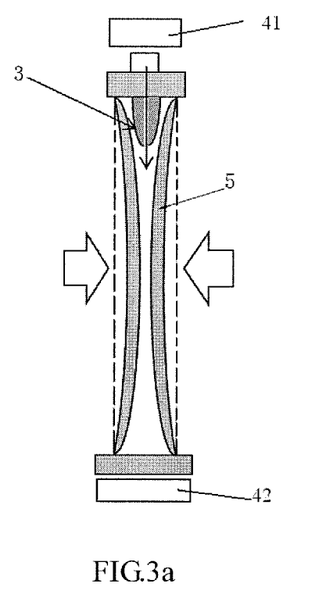
FIGS. 3a, 3b and 3c are schematic diagrams illustrating the air jet form of the coating device provided by the present invention.

As illustrated in FIG. 3a, the embodiment of the present invention provides a coating device for sealant. A sealant storage pipe is provided with two end portions; one end portion is connected to a gas jet means (a component connected with the upper end, as shown by a frame 41 in FIG. 3a) and the other end portion is connected to a nozzle (a component connected to the lower end, as shown by a frame 42 in FIG. 3a); a pipe wall 5 of the sealant storage pipe is made from a flexible material; and the pipe wall 5 can be subjected to recoverable inward deformation perpendicular to an axial line of the sealant storage pipe. Detailed description will be given below to the coating device provided by the embodiment.

As illustrated in FIG. 3a, when the coating device provided by the embodiment of the present invention is adopted for sealant coating, in order to avoid the sealant "wall-hanging" phenomenon, the balancing degree of the airflow 3 must be adjusted to avoid the phenomenon that the glue in the middle has been emptied but the residual glue on the circumference of the pipe wall 5 cannot be sprayed down. In order to adjust the balancing degree of the airflow 3 so that the sealant in the sealant storage pipe can be uniformly discharged, the shape of the pipe wall 5 must be changed, and hence the pipe wall 5 is necessary to be set to be deformable material, preferably flexible deformable material. When the coating device is used for coating, an inward force must be applied from the outside of the pipe wall 5 to the inside (as shown by arrows on both sides of the sealant storage pipe in FIG. 3a), so that the pipe wall 5 is subjected to inward (recessed) deformation perpendicular to the axial line of the sealant storage pipe, and hence the objective of improving the balancing degree of the airflow 3 can be achieved.

Herein, it should be noted that the means of applying the inward force from the outside of the pipe wall 5 to the inside may be mechanical means, magnetic field means, electric field means, etc. When the pipe wall 5 is subjected to inward (recessed) deformation, the balancing degree of the force applied to the upper portion of glue can be improved. Moreover, when the amount of glue is reduced continuously, stable airflow can be guaranteed and glue coating cannot be changed due to the change of the amount of glue. When the coating process pauses, the inward force applied from the outside of the pipe wall 5 may be removed and the pipe wall 5 is recovered under the action of own elasticity (the recess is recovered); and meanwhile, the head of the residual sealant at the coating head of the coating device is sacked back, so that uneven sectional area of the sealant can be avoided. As vacuum is not required to be used for forced sack-back on the upper portion, the phenomenon that the inside of the glue is partially separate and provided with bubbles or empty nests as the glue in the tube is raised up entirely due to relatively large force applied to the upper portion can be avoided, and finally the risk of emptying can be avoided.

Figure 3B:
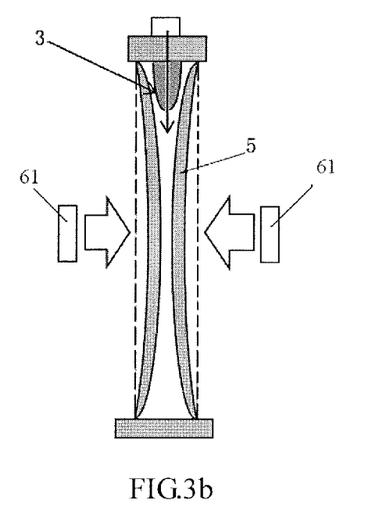

In one embodiment of the present invention, in order to allow the pipe wall 5 to be subjected to inward (recessed) deformation perpendicular to the axial line of the sealant storage pipe when the coating device is used for sealant coating, the deformable material of the pipe wall 5 may adopt deformable carbon nanotube rubber material. When the coating device is used for coating, as illustrated in FIG. 3b, motors on both sides of the pipe wall 5 are adopted to control clamping component 61 to apply an inward clamping force from the outside of the pipe wall 5 to the inside, so that the pipe wall 5 is subjected to inward (recessed) deformation perpendicular to the axial line of the sealant storage pipe. When the coating process pauses, the applied force may be removed so that the pipe wall 5 can be recovered (the recess is recovered) under the action of own elasticity; and meanwhile, the head of the residual sealant at the coating head of the coating device is sacked back.

Figure 3C:
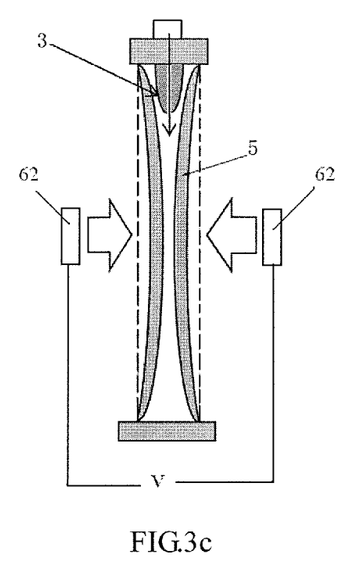

In another embodiment of the present invention, in order to further accurately control the size of deformation produced on the pipe wall 5, the deformable material of the pipe wall 5 is, for instance, a piezoelectric material. The piezoelectric material may be piezocrystal, piezoceramics, piezopolymer and piezoelectric ceramic-polymer composite, preferably, the piezopolymer and the piezoelectric ceramic-polymer composite, e.g., polyvinylidene fluoride (PVDF). The piezoelectric material is flexible, have good formability, and can satisfy the requirement on the deformation of the pipe wall 5. When the coating device is used for coating, as illustrated in FIG. 3c, electrode assemblies 62 on both sides of the pipe wall 5 are adopted to apply an inward electric field from the outside of the pipe wall 5 to the inside, so that the pipe wall 5 is subjected to inward (recessed) deformation perpendicular to the axial line of the sealant storage pipe. When the coating process pauses, the electric field may be removed so that the pipe wall 5 can be recovered under the action of own elasticity (the recess is recovered); and meanwhile, the head of the residual sealant at the coating head of the coating device is sacked back.

When the coating device provided by the embodiment of the present invention is adopted for sealant coating, as the inner wall of the hose is deformed inwards, the amount of residual glue in the hose can be reduced, so that the waste of glue can be greatly reduced. For instance, 10 g sealant may be saved in one glue change in the sixth generation (6G) production line.

Figure 4:
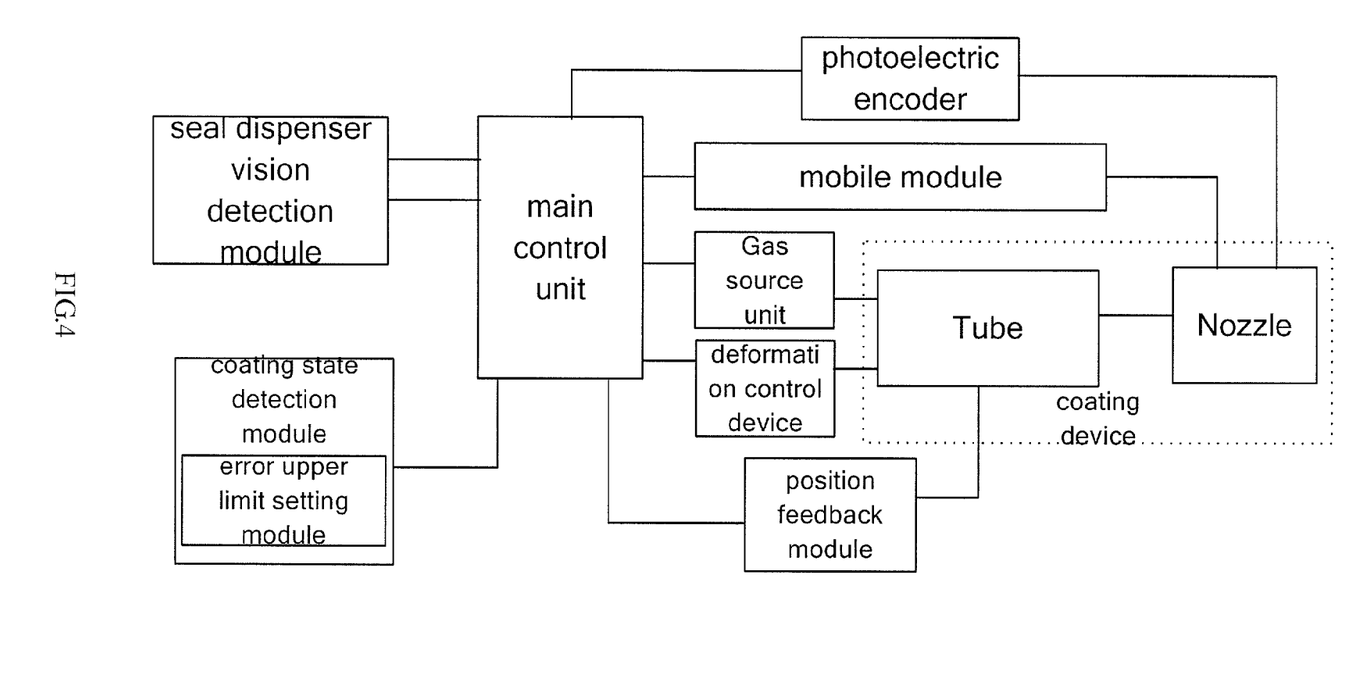
FIG. 4 is a schematic structural view of the coating system provided by the present invention.

Another embodiment of the present invention further provides a coating system employing the coating device, which, as illustrated in FIG. 4, comprises: a main control unit, a gas source unit connected to the main control unit, deformation control devices, and the coating device connected to the gas source unit and the deformation control devices. The main control unit is configured to control the amount of gas introduced from the gas source unit into the coating device, and hence control the amount of glue sprayed out from the coating device. The main control unit is configured to control the deformation control devices, so that the coating device is subjected to inward deformation perpendicular to the axial line of the sealant storage pipe or re. The main control unit, for instance, may be a central processing unit (CPU), a programmable logic controller (PLC) and other units with computing power. Detailed description will be given below to the coating system.

In the coating system for sealant, provided by the embodiment of the present invention, the gas source unit is, for instance, a CDA pressure controller, and for instance, is connected to a gas storage device (a pressure bottle), a compressor or the like; and the coating device includes a sealant storage pipe and a nozzle. The deformation control device may adopt a control device of corresponding type according to actual demands. If the sealant storage pipe is made from a carbon nanotube rubber material, the deformation control device may adopt any device through which the sealant storage pipe can be subjected to inward deformation perpendicular to the axial line of the sealant storage pipe. For instance, clamping component are disposed on both sides of the pipe wall 5; and the main control unit is configured to input a control signal into the motor and hence control the clamping component to apply a clamping force applied from the outside of the pipe wall 5, so that the pipe wall 5 is subjected to inward (recessed) deformation perpendicular to the axial line of the sealant storage pipe, as shown in FIG. 3b. If the sealant storage pipe is made from a piezoelectric material, the deformation control device may adopt any electrode assembly through which the sealant storage pipe can be subjected to inward deformation perpendicular to the axial line of the sealant storage pipe. For instance, electrode slices are disposed on both sides of the sealant storage pipe; the main control unit is adopted to apply an electric field from the outside of the pipe wall 5 to the inside on the electrode slices on both sides of the pipe wall 5; and the electrode slices are configured to clamp the pipe wall 5 under the action of the electric field, so that the pipe wall 5 is subjected to inward (recessed) deformation perpendicular to the axial line of the sealant storage pipe, as shown in FIG. 3c. The pipe wall 5 made from the above two materials is recovered (the recess is recovered) under the action of own elasticity after the applied electric field is removed, so that the head of the residual sealant at the coating head of the coating device can be sacked back.

In one embodiment of the present invention, the coating system for sealant may further comprise a coating pressure machine detection module connected to the main control unit. The main control unit is configured to receive real time information of glue coated by the coating device, detected by the coating pressure machine detection module, make corresponding adjustment control command according to the information of glue coated by the coating device, and send control information to the gas source unit; the gas source unit is configured to control the pressure intensity and the amount of gas introduced into the coating device according to the received control signal, control the pressure in the coating device, and hence control the amount of glue sprayed out from the coating device, and finally control the coating quantity of glue. The information of the glue coated by the coating device includes information such as the sectional area of a sealant surface which has been coated, the glue width and the glue position. The main control unit makes corresponding control command according to the information. For instance, the coating pressure machine detection module is a seal dispenser vision detection module, e.g., is a machine vision detection system based on a high-resolution industrial camera. The seal dispenser vision detection module is adopted to detect whether the sealant coated by the sealant coating device is qualified. The seal dispenser vision detection module is to determine whether the defects meet the requirements based on the comparison and matching of a defect library. In defect detection, a detect library is required to be established for items to be detected, and hence whether the defects are qualified is determined by the rapid comparison of physical goods and the defect library instead of the human eyes. The coating system provided by the embodiment of the present invention adopts the seal dispenser vision detection module for non-contact detection and measurement, has higher accuracy and wider spectral response range, can work stably for a long time, and hence saves a large amount of labor resources and greatly improves the working efficiency. In addition, the means may also be adopted for detecting the defects such as spots, pits, scratches, color difference and loss on surfaces of workpieces.

In one embodiment of the present invention, the coating system for sealant may further comprise a coating state detection module connected to the main control unit. The main control unit is configured to receive real time fluctuation information of glue coated by the coating device, detected by the coating state detection module, send corresponding adjustment control command according to the flotation information of the glue coated by the coating device, and send control information to the gas source unit. The gas source unit is configured to control the pressure intensity and the amount of gas introduced into the coating device according to the received control signal, control the pressure in the coating device, and hence control the amount of glue sprayed out from the coating device, and finally control the coating quantity of glue. For instance, the coating state detection module includes an error upper limit setting module. The working process of the coating state detection module is as follows: a fluctuation information error upper limit value is inputted into the coating system for sealant through the error upper limit setting module at first; the upper limit value is stored into a storage unit; and subsequently, coating is performed. For instance, image information of a part, which has been coated by the sealant, on the substrate is captured through a camera; the image information is analyzed and processed by a computing device; fluctuation information error of the coated sealant is compared with a preset error value; if the error exceeds the upper limit of the preset error value, the coating process continues; and if not, the coating pressure information will be temporarily stored into the sealant coating system which will continue to coat sealant on other parts of the substrate. The detection module or device, for instance, may be merged and combined, and for instance, employs the same hardware system and different processing software sections.

In one embodiment of the present invention, the coating system for sealant may further comprise a coating glue position feedback module connected to the main control unit. The main control unit is configured to receive real time residue information of sealant in the sealant storage pipe of the coating device, detected by the coating glue position feedback module, make corresponding adjustment control command according to the residue information of the sealant in the sealant storage pipe, and send control information to the deformation control devices. The deformation control device may apply an inward clamping force from the outside of the pipe wall 5 to the inside according to the received control signal, so that the pipe wall 5 is subjected to inward (recessed) deformation perpendicular to the axial line of the sealant storage pipe. Herein, it should be noted that the clamping force applied by the deformation control device from the outside of the pipe wall 5 to the inside may be gradually increased according to the residue information of the coating glue detected by the coating glue position feedback module, so that the sealant storage pipe can be slowly deformed. The coating glue position feedback module, for instance, may be achieved by a sensor or a vision processor for detecting the liquid position.

The coating system for sealant may further comprise: a mobile module and a photoelectric encoder module respectively connected to the main control unit. The photoelectric encoder module and the mobile module are respectively connected to the coating device. The photoelectric encoder module is configured to detect the sectional area of the currently coated sealant, and the mobile module is configured to control the height between the coating device and the substrate. The main control unit is configured to receive real time sectional area information of the currently coated glue of the coating device, detected by the photoelectric encoder module, and send control information to the gas source unit. The gas source unit is configured to control the pressure intensity and the amount of gas introduced into the coating device according to the received control signal, control the pressure in the coating device, and hence control the amount of glue sprayed out from the coating device. The main control unit sends control information to the mobile module. The mobile module is, for instance, a mobile motor (e.g., a stepping motor). The main control unit is configured to receive the height between the coating device and the substrate, transmitted by the mobile motor, in real time, and send control signal to the mobile motor. The mobile motor is configured to control the movement of a cylinder according to the received control signal, control the distance between the coating device and the substrate, and finally achieve the objective of continuously detecting and adjusting the coating pressure of the coating device and improving the coating quality of the sealant.

The embodiment of the present invention further provides a coating method employing the coating device, which comprises the following steps: subjecting a pipe wall to recoverable inward deformation perpendicular to an axial line of a sealant storage pipe during spraying; and subjecting the pipe wall to recovery when the spraying ends. Detailed description will be given below to the coating method.

Figure 5:
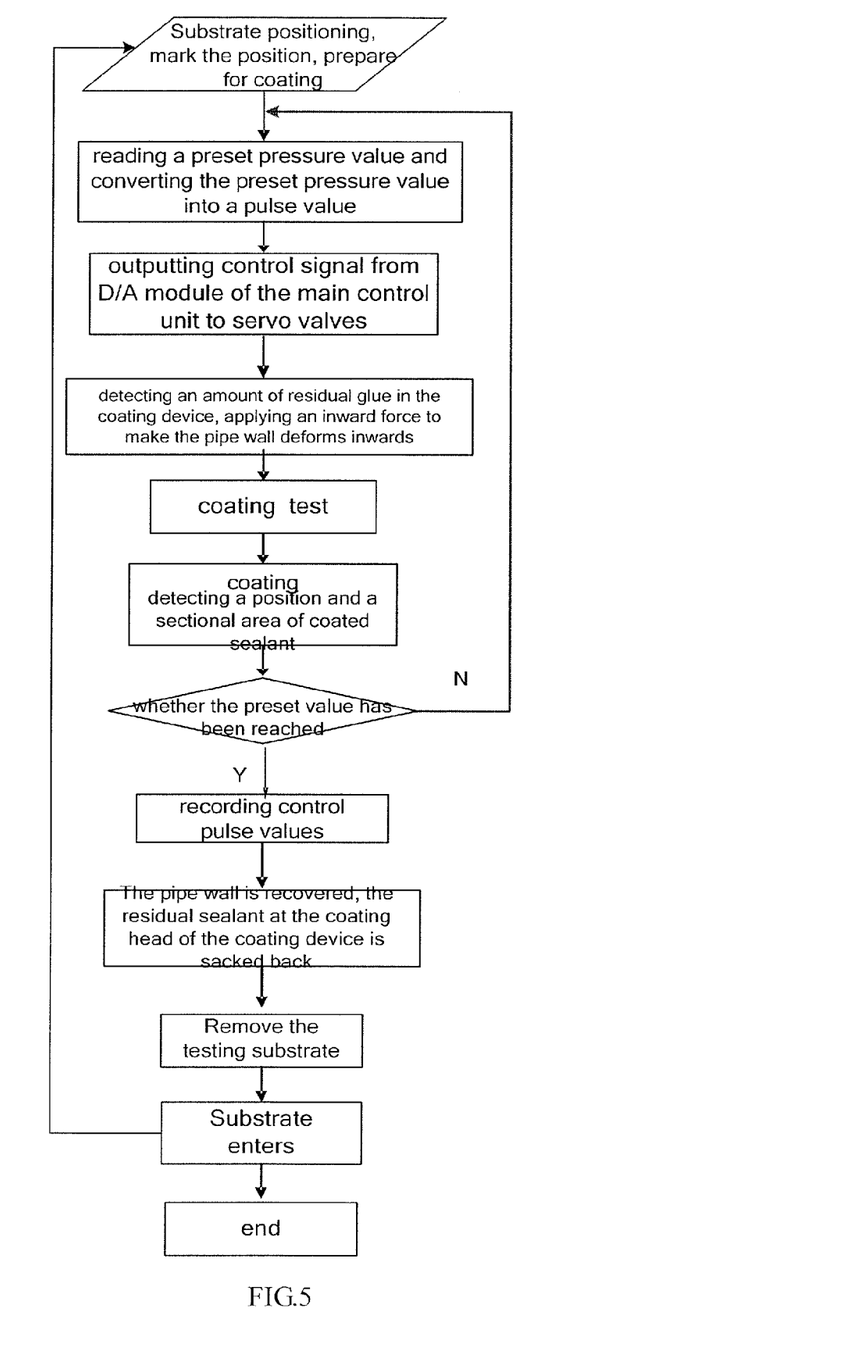
FIG. 5 is a flowchart of the coating method provided by the present invention.

As illustrated in FIG. 5, the coating method for sealant coating, provided by the embodiment of the present invention, specifically comprises the following steps: determining the position of a substrate; reading a preset pressure value and converting the preset pressure value into a pulse value; outputting a control signal to a coating device; and detecting the residue of glue in the coating device. A force is applied from the outside of the pipe wall to the inside according to the residue of glue in the coating device, so that the pipe wall is deformed inwards. Sealant is coated by test; the position and the sectional area of coated sealant are detected and whether the preset value has been reached is determined; if the preset value has not been reached, the pressure value is adjusted and converted into the pulse value again; and if the preset value has been reached, control pulse values of control elements are recorded and taken as initial control pulse values in the case of spraying. The force is removed; the pipe wall is recovered; and the substrate is removed.

Of course, as illustrated in FIG. 5, in order to further ensure that the sealant coated by the coating method for sealant coating, provided by the present invention, has higher yield, the method provided by the embodiment may further comprise the step of repeating the steps and utilizing a test substrate to test the coating method. After the method is tested and determined to have met corresponding requirements, lots of substrates are introduced and coated according to the recorded control pulse values of the control elements.

Figure 6:
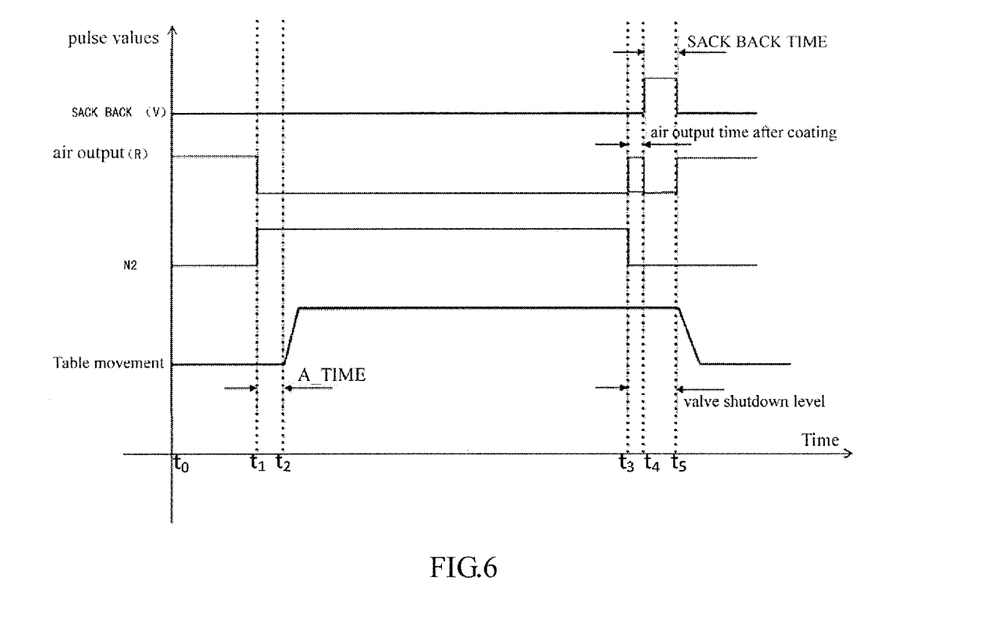
FIG. 6 is a schematic diagram illustrating the control timing sequence of the coating method provided by the present invention.

As illustrated in FIGS. 5 and 6, detailed description will be given below to the coating method provided by the embodiment of the present invention by taking the case that the coating system sends different control commands to different modules at different time periods as an example. After the substrate enters a coating area, the substrate must be positioned at first, and the mark position is positioned and prepared for coating. The main control unit reads a pressure value preset by a user at to moment and converts the preset pressure value into a pulse value. The main control unit outputs corresponding control signal to the gas source unit. The gas source unit outputs air after receiving the control signal, so that the sealant in the coating device can be discharged. At this point, residual glue in the sealant storage pipe of the coating device must be monitored uninterruptedly; and the deformation control devices are controlled according to the residue information to apply an force from the outside of the pipe wall to the inside gradually, so that the pipe wall is gradually deformed inwards along with the reduced amount of glue. At $t_1$ moment, the main control unit outputs corresponding control signal to the gas source unit; and air output is switched off and nitrogen output is switched on. At $t_2$ moment, the main control unit outputs corresponding control signal to the mobile module which is slowly started to move the substrate. The coating position and the sectional area are detected and whether the preset value has been reached is determined. If the preset value has not been reached, the pressure value is adjusted and converted into the pulse value again. If the preset value has been reached, control pulse values of control elements are recorded and the preset pressure value is updated. At $t_3$ moment, the main control unit outputs corresponding control signal to the gas source unit; and nitrogen output is switched off and air output is switched on. At $t_4$ moment, the main control unit outputs corresponding control signal to the gas source unit and air output is switched off; and the main control unit outputs corresponding control signal to the deformation control devices, so that the pipe wall is recovered. At $t_5$ moment, the main control unit outputs corresponding control signal to the deformation control devices, so that the pipe wall stops deformation recovering; the main control unit outputs corresponding control signal to the mobile module which is slowly started to remove the substrate; and hence the entire coating process ends.

In summary, the coating device, system and method for sealant coating, provided by the embodiment of the present invention, can effectively solve the problems of sealant wall-hanging, low sack-back accuracy, wide initial coating position, etc. In the case of coating, the hose is recessed by the change of the shape of the hose; the balancing degree of the force applied to the upper portion of the airflow glue is improved; stable airflow is guaranteed when the amount of glue is continuously reduced; and glue coating cannot be changed due to the change of the amount of glue. In the case of sack-back, the glue is sacked back by utilization of the outward movement of the pipe wall. Therefore, not only the sack-back amount can be well controlled but also the overall deformation recovering of the glue can be maintained, and hence the phenomenon of slight inside breakage of glue can be avoided.

The foregoing is only the preferred embodiments of the present invention and not intended to limit the scope of protection of the present invention. The scope of protection of the present invention should be defined by the appended claims.

The application claims priority of China Patent application No. 201410523099.3 filed on Sep. 30, 2014, the content of which is incorporated in its entirety as part of the present application by reference herein.

The invention claimed is:

1. A coating device for sealant, comprising a sealant storage pipe, wherein the sealant storage pipe is provided with two end portions; one end portion is connected to a gas jet means and the other end portion is connected to a nozzle;
   a pipe wall of the sealant storage pipe is made from a flexible material; and the pipe wall can be subjected to recoverable inward deformation perpendicular to an axial line of the sealant storage pipe.

2. The coating device according to claim 1, wherein the flexible material is a piezoelectric material; and the pipe wall is deformed when an electric field is applied and recovered when the electric field is removed.

3. The coating device according to claim 2, wherein the piezoelectric material is one or more materials selected from the group consisting of: piezocrystal, piezoceramics, piezopolymer and piezoelectric ceramic-polymer composite.

4. A coating system for sealant, comprising:
   a main control unit, a gas source unit connected to the main control unit, deformation control devices, and the coating device according to claim 3 connected to the gas source unit, wherein
   the main control unit is configured to control an amount of gas introduced from the gas source unit into the coating device, and hence control an amount of glue sprayed out from the coating device; and the main control unit is configured to control the deformation control devices to act on the coating device, so that the pipe wall of the sealant storage pipe of the coating device is subjected to inward deformation perpendicular to the axial line of the sealant storage pipe or recovery.

5. A coating system for sealant, comprising:
   a main control unit, a gas source unit connected to the main control unit, deformation control devices, and the coating device according to claim 2 connected to the gas source unit, wherein
   the main control unit is configured to control an amount of gas introduced from the gas source unit into the coating device, and hence control an amount of glue sprayed out from the coating device; and the main control unit is configured to control the deformation control devices to act on the coating device, so that the pipe wall of the sealant storage pipe of the coating device is subjected to inward deformation perpendicular to the axial line of the sealant storage pipe or recovery.

6. The coating device according to claim 1, wherein the flexible material is a carbon nanotube rubber material; and the pipe wall is deformed when a clamping force is applied and recovered when the clamping force is removed.

7. A coating system for sealant, comprising:
a main control unit, a gas source unit connected to the main control unit, deformation control devices, and the coating device according to claim 6 connected to the gas source unit, wherein
the main control unit is configured to control an amount of gas introduced from the gas source unit into the coating device, and hence control an amount of glue sprayed out from the coating device; and the main control unit is configured to control the deformation control devices to act on the coating device, so that the pipe wall of the sealant storage pipe of the coating device is subjected to inward deformation perpendicular to the axial line of the sealant storage pipe or recovery.

8. A coating system for sealant, comprising:
a main control unit, a gas source unit connected to the main control unit, deformation control devices, and the coating device according to claim 1 connected to the gas source unit, wherein
the main control unit is configured to control an amount of gas introduced from the gas source unit into the coating device, and hence control an amount of glue sprayed out from the coating device; and the main control unit is configured to control the deformation control devices to act on the coating device, so that the pipe wall of the sealant storage pipe of the coating device is subjected to inward deformation or outward recovery perpendicular to the axial line of the sealant storage pipe.

9. The coating system according to claim 8, wherein the sealant storage pipe is made from a carbon nanotube rubber material; the deformation control device includes a clamping component configured for clamping the sealant storage pipe and a motor connected to the clamping component;
the main control unit is configured to input a control signal into the motor and control the clamping component to apply an inward clamping force from an outside of the pipe wall, so that the pipe wall is subjected to inward deformation perpendicular to the axial line of the sealant storage pipe.

10. The coating system according to claim 8, wherein the sealant storage pipe is made from a piezoelectric material; the deformation control devices are electrode assemblies for clamping both sides of the pipe wall; and
the main control unit is configured to input a control signal into the electrode assemblies and control the electrode assemblies to apply an inward electric field from an outside of the pipe wall, so that the pipe wall is subjected to inward deformation perpendicular to the axial line of the sealant storage pipe.

11. The coating system according to claim 8, wherein the coating system further comprises a coating pressure machine detection module connected to the main control unit; and
the main control unit is configured to receive real time information of glue coated by the coating device, detected by the coating pressure machine detection module, send control information to the gas source unit, and hence control a coating quantity of the coating device.

12. The coating system according to claim 8, wherein the coating system further comprises a coating state detection module connected to the main control unit; and
the main control unit is configured to receive real time fluctuation information of glue coated by the coating device, detected by the coating state detection module, send control information to the gas source unit, and hence control the coating quantity of the coating device.

13. The coating system according to claim 8, wherein the coating system further comprises a coating glue position feedback module connected to the main control unit; and
the main control unit is configured to receive real time residue information of sealant in the sealant storage pipe of the coating device, detected by the coating glue position feedback module, send control information to the deformation control devices, and hence control the deformation of the sealant storage pipe.

14. A coating method for sealant coating utilizing the coating device according to claim 1, comprising the following steps:
subjecting a pipe wall to recoverable inward deformation perpendicular to an axial line of a sealant storage pipe during spraying; and
subjecting the pipe wall to recovery when the spraying ends.

15. The coating method according to claim 14, before the spraying, further comprising:
determining a position of a substrate;
reading a preset pressure value and converting the preset pressure value into a pulse value;
outputting a control signal to a coating device; and
detecting an amount of residual glue in the coating device.

16. The coating method according to claim 14, during the spraying, further comprising:
applying an inward force from an outside of the pipe wall according to the amount of residual glue in the coating device, so that the pipe wall deforms inwards.

17. The coating method according to claim 14, before the spraying, further comprising:
coating sealant by test;
detecting a position and a sectional area of coated sealant to determine whether the preset value has been reached;
returning to adjust a pressure value and converting the pressure value into a pulse value again if the preset value has not been reached; and
recording a control pulse value of each control element as an initial control pulse value for the spraying if the preset value has been reached.

* * * * *